United States Patent
Lubicki et al.

(10) Patent No.: US 7,821,213 B2
(45) Date of Patent: Oct. 26, 2010

(54) TECHNIQUES FOR CONTROLLING A CHARGED PARTICLE BEAM

(75) Inventors: Piotr R. Lubicki, Peabody, MA (US);
Russell J. Low, Rowley, MA (US);
Stephen E. Krause, Ipswich, MA (US);
Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 635 days.

(21) Appl. No.: 11/865,336

(22) Filed: Oct. 1, 2007

(65) Prior Publication Data
US 2009/0085504 A1    Apr. 2, 2009

(51) Int. Cl.
*H05H 9/00* (2006.01)
(52) U.S. Cl. .................................. 315/505; 315/5.42
(58) Field of Classification Search ............... 315/5.42, 315/500–507, 111.61; 204/176
See application file for complete search history.

(56) References Cited

U.S. PATENT DOCUMENTS

| 6,319,469 | B1 * | 11/2001 | Mian et al. ................. 422/64 |
| 6,717,079 | B2 | 4/2004 | Heller |
| 6,919,698 | B2 * | 7/2005 | Krichtafovitch ............ 315/506 |
| 2004/0254419 | A1 * | 12/2004 | Wang et al. ................. 600/8 |

* cited by examiner

*Primary Examiner*—Douglas W Owens
*Assistant Examiner*—Jimmy T Vu

(57) ABSTRACT

Techniques for controlling a charged particle beam are disclosed. In one particular exemplary embodiment, the techniques may be realized as a charged particle acceleration/deceleration system. The charged particle acceleration/deceleration system may comprise an accelerator column, which may comprise a plurality of electrodes. The plurality of electrodes may have apertures through which a charged particle beam may pass. The charged particle acceleration/deceleration system may also comprise a voltage grading system. The voltage grading system may comprise a first fluid reservoir and a first fluid circuit. The first fluid circuit may have conductive connectors connecting to at least one of the plurality of electrodes. The voltage grading system may further comprise fluid in the first fluid circuit. The fluid may have an electrical resistance.

24 Claims, 4 Drawing Sheets

TECHNIQUES FOR CONTROLLING A CHARGED PARTICLE BEAM

FIELD OF THE DISCLOSURE

The present disclosure relates generally to semiconductor manufacturing and, more particularly, to techniques for controlling a charged particle beam.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

To form devices on a semiconductor wafer, it is usually necessary to implant impurities at different depths of the semiconductor wafer. The energy of impurities in an ion beam directed toward the semiconductor wafer is determinative of the depth to which the impurities penetrate into the semiconductor wafer. As devices are reduced in size and increased in speed, it has become desirable to use very low energy ion beams to form, for example, shallow transistor junctions in the semiconductor wafer.

At the same time, high energy ion implantation may help minimize production costs because high energy ion implantation does not require some conventional processes, such as, but not limited to, the masking of a semiconductor wafer, to be performed. Also, semiconductor devices manufactured through the use of high energy ion implantation may exhibit relatively low levels of junction leakage and improved latch-up characteristics. Thus, the production yield may be high with respect to an ion implantation process carried out by high energy ion implantation. Therefore, high energy ion implantation may be widely used for implanting ions in semiconductor device manufacturing processes.

FIG. 1 depicts a prior art ion implanter system 100. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. The ion source 102, the extraction manipulator 104, and the filter magnet 106 may be housed in a terminal 118. Much like a series of optical lenses that manipulate a light beam, the ion implanter components can filter and focus the ion beam 10 before steering it towards an end station 120. The ion implanter components that can filter and focus the ion beam 10 may be referred to as optical elements, or beam optics.

The acceleration or deceleration column 108 is a critical component to the ion implanter system 100. As the range of required energy level for ion beam may be wide (e.g., from about 1 kV to above 600 kV), the acceleration or deceleration column 108 may be required to accelerate or decelerate ions to a wide voltage spectrum (e.g., from about 1 kV to above 600 kV).

Conventionally, a resistive divider may be used to gradually accelerate (divide the acceleration potential) or decelerate (divide the deceleration potential) the ion beam along the column 108. That is, one or more resistors may be electrically connected between adjacent electrodes along the column 108. A plurality of resistors may thus form a chain of resistors. Each electrode of the column 108 may be electrically connected to certain electrical contacts along the resistor chain. Thus, the acceleration voltage or deceleration voltage may be distributed by the resistors. The distribution of voltage along the column 108 may be referred to as grading. As the operational voltage spectrum gets wider and upper voltage gets higher, there may be at least two concerns with the conventional resistive divider.

The first concern with the conventional resistive divider in wide range voltage ion implantation may be ballast current. Electrical current flowing through a conventional resistive divider may be referred to as divider current. The divider current sometimes may be referred to as ballast current as it may facilitate the maintenance of a voltage gap between electrodes of the column 108.

For high energy acceleration, beam rigidity may be high. That is, amount of magnetic force or electrostatic force required to deflect a beam may be high. In the mode of high energy acceleration, most ions of an ion beam will not stray away from the direction the ion beam is going and will pass through an aperture of the electrodes of the column 108. Because the ions are charged particles, the transportation of the ions may have an ion beam current. So, for high energy acceleration, there is little interception of ions by the electrodes of the column 108. The ion beam current may have very little loss. The electrodes are not going to charge up since the ion beam is well focused and stable operation can be achieved. Thus, divider current flowing through the chain of dividing resistors may be relatively low (e.g., hundreds of micro amperes), but may still maintain the voltage gap between electrodes of the column 108. Therefore, a relatively low ballast current may be required for high energy acceleration.

When the acceleration voltage goes down (e.g., low to medium energy acceleration or deceleration), the divider current may be in low micro-amperes (i.e., V/R is lower). In this case, low current may perform grading. However, beam rigidity may also be lower compared with high energy acceleration. That is, compared to a high energy mode of operation, more ions may stray away from the ion beam and get intercepted by the electrodes of the column 108. In certain instances, the ion beam may generate secondary ions/electrons that may intercept the electrodes of the column 108. When sufficient ions/electrons intercept the electrodes of the column 108, latch-up may occur. That is, the divider current may be insufficient to maintain the voltage gap between two electrodes and can lead to voltage collapse. Latch-up may cause focus degradation and eventually lead to an unrecoverable situation due to the electrodes of the column 108 changing voltage from ion/electron current. Very similar instability may occur for the deceleration.

Generally, the lower the ion beam energy, the higher the current flowing through the resistor chain may be required. Therefore, much higher ballast current may be required for low energy acceleration and deceleration than for the high energy acceleration. This is practically impossible to accomplish by using just a linear single resistor chain. For example, when the beam has a low energy, the Ohms law dictates a low resistance to maintain a sufficient current ($I=V/R$). However, when the beam has a high energy, a high voltage may be necessary. Power generated may be high if both current and voltage are high ($P=IV=I^2R=V^2/R$). A lot of heat may be generated by the current. The resistors may get extremely hot and their resistance changes.

One possible solution to the above described problems has been to use switches to select a different resistor chain with lower resistance for low energy acceleration and deceleration. The switches may be activated electrically and may be referred to as electrical switches. The electrical switches may be activated by relays, for example. The switches may also be powered by pressurized fluid and may be referred to as hydraulic/pneumatic switches. The hydraulic/pneumatic switches may be activated by pressurized media in a conduit made of dielectrical material (e.g., polytetrafluoroethylene (PTFE) air lines). However, for low resistance resistors, the ballast current typically becomes very high and generates a lot of heat on the resistors, possibly leading to over-heating and thermal failure. To avoid this from happening, proper switching sequence depending on acceleration voltage may be chosen.

The second concern with the conventional resistive divider in wide range of voltage for ion implantation may be high electric field stress that each resistor may be required to be protected against. In a high energy mode, a high acceleration voltage (e.g., above 650 kV) may be graded over the resistor chain. Conductive materials of the resistors, such as lead or ferrule connections, may need shielding due to high electric field stress. Such shielding has previously been achieved by placing the resistor chain in a pressurized vessel that may be filled with a high dielectric strength material (e.g., SF6 gas). However, service of the resistor chain is not easy in such configuration as the pressurized vessel needs to be drained, which may be slow and labor intensive.

In view of the foregoing, it may be understood that there are significant problems and shortcomings associated with current technologies in controlling an accelerated or decelerated charged particle beam for ion implanters.

SUMMARY OF THE DISCLOSURE

Techniques for controlling a charged particle beam are disclosed. In one particular exemplary embodiment, the techniques may be realized as a charged particle acceleration/deceleration system. The charged particle acceleration/deceleration system may comprise an accelerator column, which may comprise a plurality of electrodes. The plurality of electrodes may have apertures through which a charged particle beam may pass. The charged particle acceleration/deceleration system may also comprise a voltage grading system. The voltage grading system may comprise a first fluid reservoir and a first fluid circuit. The first fluid circuit may have conductive connectors connecting to at least one of the plurality of electrodes. The voltage grading system may further comprise fluid in the first fluid circuit. The fluid may have an electrical resistance.

In accordance with other aspects of this particular exemplary embodiment, the fluid may be a fluid flow circulating through the first reservoir and the first fluid circuit.

In accordance with further aspects of this particular exemplary embodiment, the voltage grading system may further comprise a fluid supply.

In accordance with additional aspects of this particular exemplary embodiment, the voltage grading system may further comprise a electrical resistance adjustor connected to the fluid.

In accordance with one aspect of this particular exemplary embodiment, the voltage grading system may comprise a second fluid reservoir. In addition, the voltage grading system may comprise two uni-directional valves and a three-way valve. One of the two uni-directional valves may connect the first fluid reservoir to the first fluid circuit, the other of the two uni-directional valves may connect the second fluid reservoir to the first fluid circuit, and the three-way valve may connect the fluid to the first fluid reservoir and the second fluid reservoir. Further, the fluid in the first fluid reservoir may have a first electrical resistance value and the fluid in the second fluid reservoir may have a second electrical resistance value.

In accordance with another aspect of this particular exemplary embodiment, the voltage grading system may also comprise a second fluid circuit. The voltage grading system may further comprise two uni-directional valves and a three-way valve. One of the two uni-directional valves may connect the first fluid circuit to the fluid, the other of the two uni-directional valves may connect the second fluid circuit to the fluid, the three-way valve may connect the fluid to the first fluid circuit and the second fluid circuit.

In accordance with yet another aspect of this particular exemplary embodiment, the voltage grading system may further comprise a resistivity monitor connected to the fluid.

In accordance with still another aspect of this particular exemplary embodiment, the voltage grading system may further comprise a pump connected to the fluid.

In accordance with a further aspect of this particular exemplary embodiment, the fluid flow may be de-ionized water. The de-ionized water may have additives to lower the resistance. Moreover, the de-ionized water may be chilled. Further, the voltage grading system may further comprise a deionization filter.

In accordance with a yet further aspect of this particular exemplary embodiment, the charged particle acceleration/deceleration system may further comprise at least one resistor connected between two of the plurality of electrodes.

In another particular exemplary embodiment, the techniques may be realized as a method for controlling a charged particle beam. The method may comprise connecting a voltage grading system to an accelerator column. The accelerator column may comprise a plurality of electrodes having apertures through which a charged particle beam may pass. The voltage grading system may comprise a first fluid circuit with fluid. The fluid may have a electrical resistance value for a first mode of operation. The method may further comprise adjusting the electrical resistance of the fluid to a different value for a second mode of operation.

In accordance with other aspects of this particular exemplary embodiment, the fluid may be a fluid flow circulating through the first fluid circuit. The voltage grading system may further comprise a second fluid circuit. The method may further comprise switching the fluid flow to the second fluid circuit.

In accordance with further aspects of this particular exemplary embodiment, the voltage grading system may further comprise a electrical resistance adjustor, wherein adjusting the electrical resistance of the fluid flow to a different value may comprise adding a conductive fluid solution to the fluid flow through the electrical resistance adjustor.

In accordance with additional aspects of this particular exemplary embodiment, the voltage grading system may further comprise a first fluid reservoir and a second fluid reservoir, wherein adjusting the electrical resistance of the fluid flow to a different value may comprise switching from the first fluid reservoir to the second fluid reservoir. Furthermore, the voltage grading system may comprise a third reservoir, wherein adjusting the electrical resistance of the fluid flow to a different value may comprise mixing the fluid from the first and second reservoirs together in the third reservoir.

In accordance with still other aspects of this particular exemplary embodiment, the method may further comprise connecting at least one resistor between two of the plurality of electrodes.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
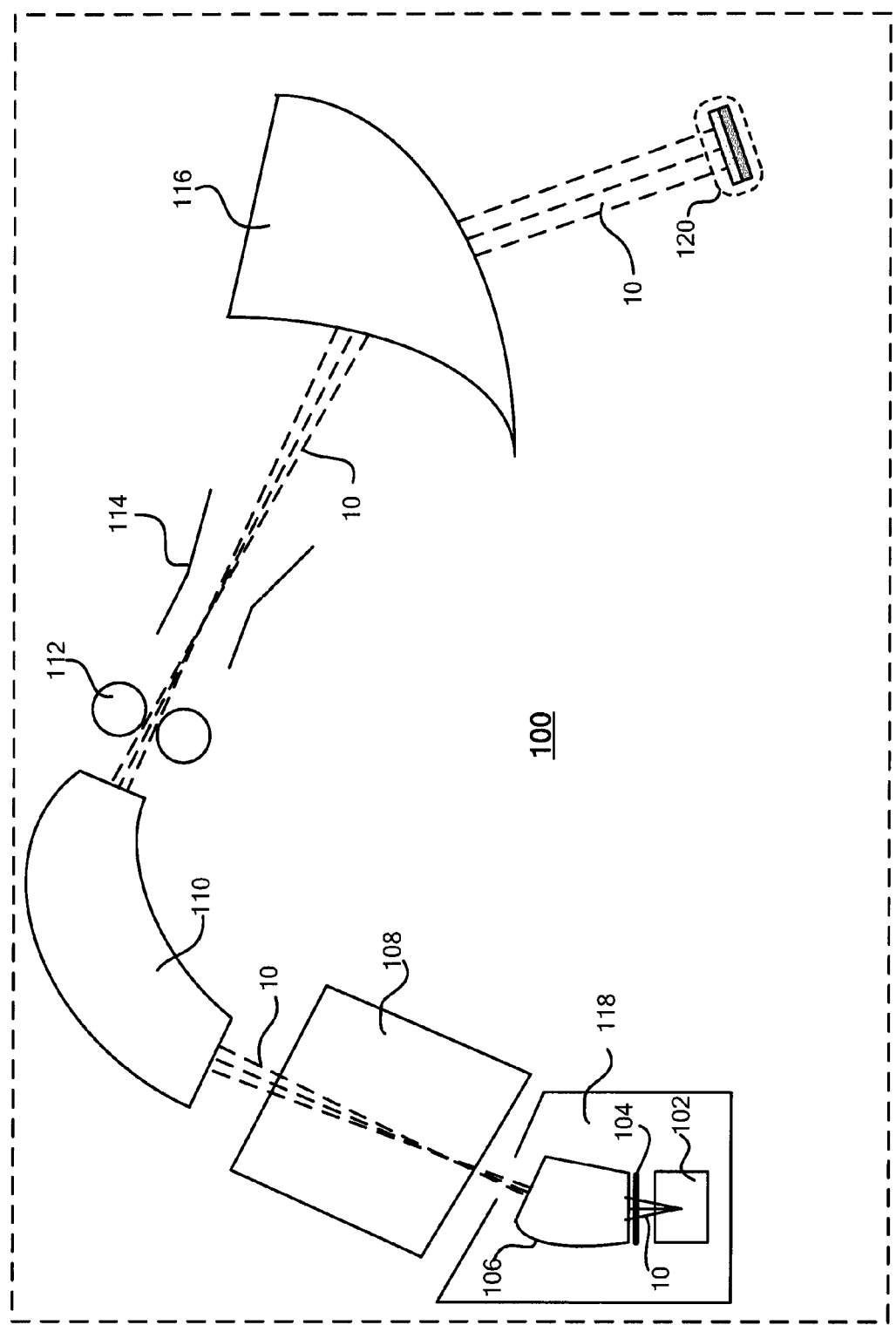
FIG. 1 depicts a conventional ion implanter system.
Figure 2:
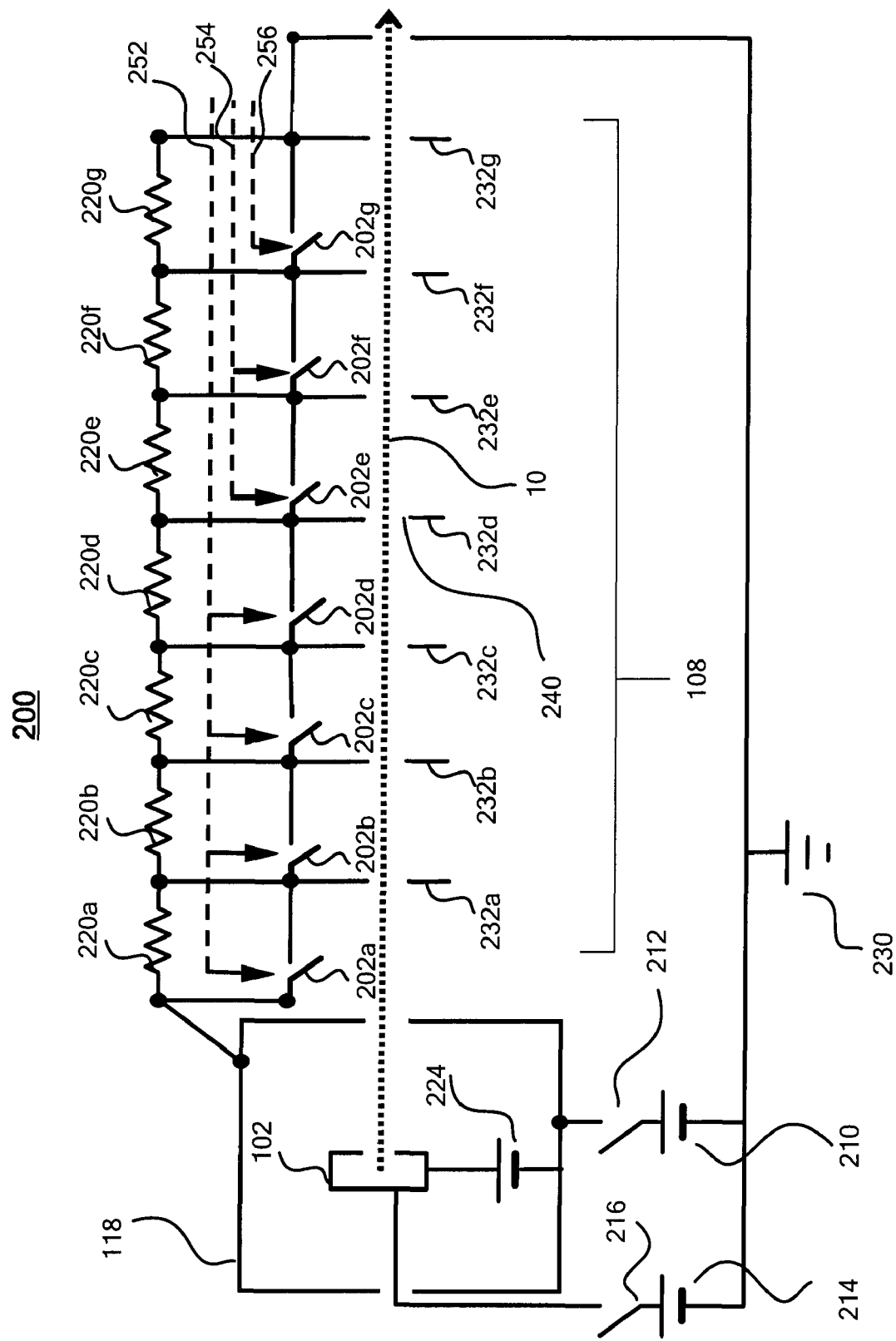
FIG. 2 depicts a schematic diagram of a charged particle acceleration/deceleration system in accordance with an embodiment of the present disclosure.

FIG. 2 depicts a schematic diagram of a charged particle acceleration/deceleration system 200 of an ion implanter in accordance with an embodiment of the present disclosure. It should be appreciated by one skilled in the art that only the ion beam 10, ion source 102, the terminal 118, and acceleration or deceleration column 108 are incorporated into FIG. 2. As a result, those elements in FIG. 2 should be understood in relation to corresponding elements in FIG. 1.

Referring to FIG. 2, in the charged particle acceleration/deceleration system 200, the ion beam 10 may be extracted from the ion source 102. The ion source 102 may be referenced to an extraction power supply 224. The extraction power supply 224 may provide a positive voltage for the ion source 102 relative to the terminal 118. The ion source 102 may be separated from a ground 230 by a deceleration switch 216 and a deceleration power supply 214. The ion source 102 may also be separated from the ground 230 via the extraction power supply 224, an acceleration switch 212 and an acceleration power supply 210. The terminal 118 may be separated from the ground 230 by the acceleration switch 212 and the acceleration power supply 210. It should be noted that an charged particle acceleration/deceleration system in accordance with the present disclosure may accelerate and/or decelerate an ion beam.

The extracted ion beam 10 may then pass through an aperture on the terminal 118 and enter the acceleration or deceleration column 108 shown in FIG. 2. The acceleration or deceleration column 108 may be schematically depicted in FIG. 2 by a plurality of electrodes 232. The plurality of electrodes 232 may be spaced-apart conductive plates having apertures 240. In the embodiment of FIG. 2, the plurality of electrodes 232 includes electrodes 232a, 232b, 232c, 232d, 232e, 232f and 232g. The ion beam 10 may be accelerated or decelerated to a specific energy level and then leave the acceleration or deceleration column 108.

A positive voltage supplied by the acceleration power supply 210 may be applied to the electrodes 232 by a chain of resistors 220 and a chain of hydraulic/pneumatic or electrical switches 202 to manage the beam optics depending on acceleration voltage. In the embodiment of FIG. 2, the chain of resistors 220 includes resistors 220a, 220b, 220c, 220d, 220e, 220f and 220g. Parallel to the resistors 220, the chain of switches 202 may include switches 202a, 202b, 202c, 202d, 202e, 202f and 202g. A resistor and its corresponding switch may be referred to as a grading resistor assembly. Thus, there are seven resistor assemblies shown in the charged particle acceleration/deceleration system 200 to divide acceleration voltage into seven equal potentials. It should be noted that the resistors 220 may not have the same resistance value in other embodiment in accordance with the present disclosure, and the voltage may not be divided equally. Moreover, as shown in FIG. 2, the chain of switches 202 may be grouped in 3 groups. The switches 202a, 202b, 202c and 202d may be connected to a control cable 252. The switches 202e and 202f may be connected to a control cable 254. The switch 202g may be connected to a control cable 256. Therefore, the seven resistor assemblies may be selectively controlled by the control cables 252, 254 and 256. The chain of resistor assemblies may be referred to as a voltage grading resistor assembly chain in the present disclosure. Also, each of the control cables may be referred to as an actuator in the present disclosure.

In one exemplary embodiment of the charged particle acceleration/deceleration system 200, each of the switches 202 may be activated by pressurized air, gas or liquid as will be described later. Therefore, each actuator may be pressurized air lines made of dielectrical material and may operate switches by pressurized air, gas or liquid (e.g., PTFE air lines).

In another exemplary embodiment of the charged particle acceleration/deceleration system 200, each of the switches 202 may be activated electrically. Therefore, each actuator may operate switch(es) by transmitting electrical signals (e.g., relays).

Figure 3:
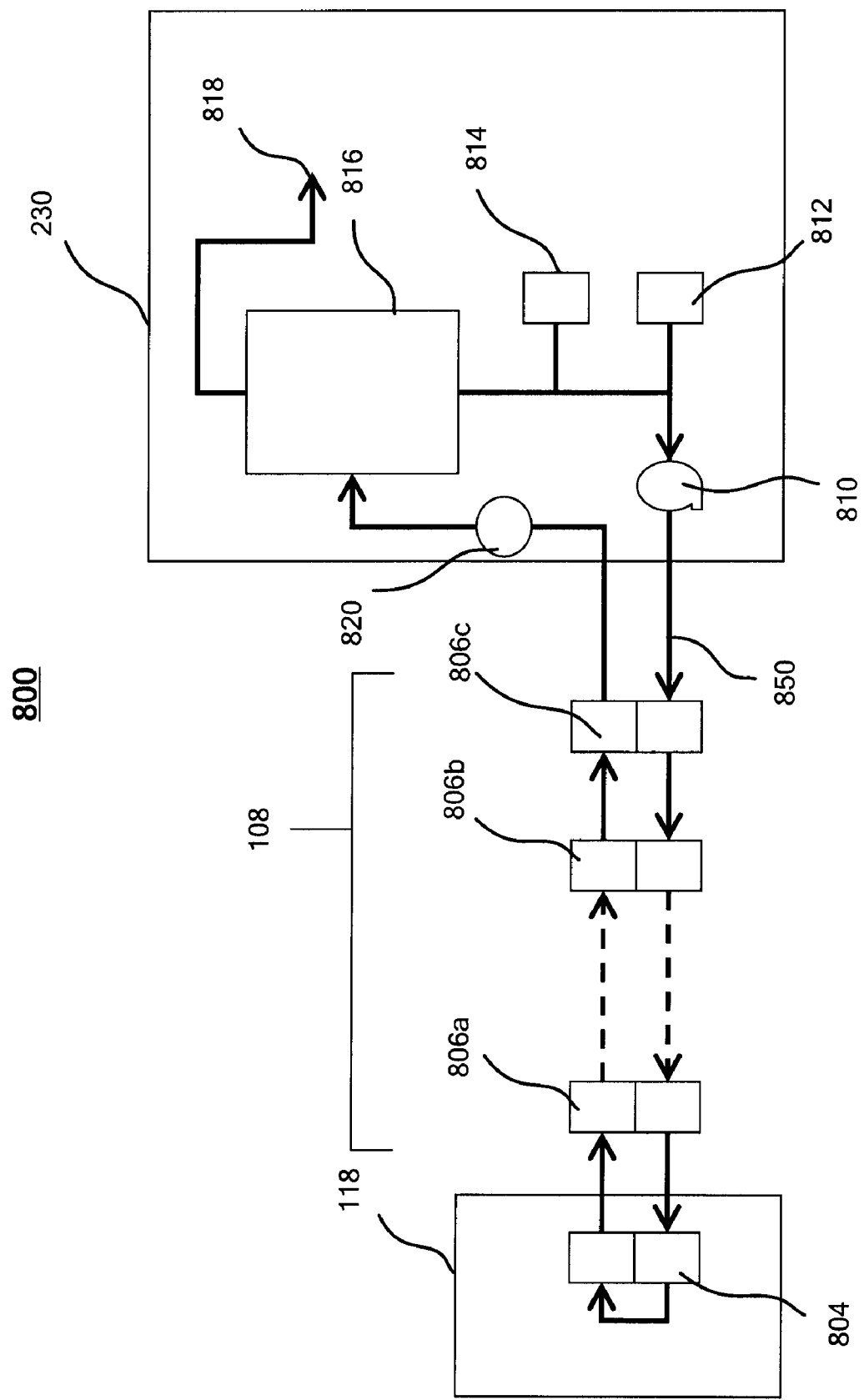
FIG. 3 depicts a schematic diagram of a voltage grading system using fluid in accordance with an exemplary embodiment of the present disclosure.

FIG. 3 depicts a schematic diagram of a voltage grading system 800 in accordance with an exemplary embodiment of the present disclosure. The voltage grading system 800 may use a fluid with electrical resistance to grade a voltage. The voltage grading system 800 may be used in an exemplary embodiment of a charged particle acceleration/deceleration system in accordance with the present disclosure. In one exemplary embodiment in accordance with the present disclosure, the voltage grading system 800 may be used alone to provide voltage distribution across the terminal 118 and electrodes of an acceleration/deceleration column 108, as shown in FIG. 3. In another exemplary embodiment in accordance with the present disclosure, the voltage grading system 800 may be used in conjunction with resistor assemblies shown in FIG. 2.

Referring to FIG. 3, in the exemplary voltage grading system 800 in accordance with an embodiment of the present disclosure, there is a loop of fluid flow 850 circulating between the terminal 118 and the ground 230. The fluid flow 850 may be pumped by a pump 810 and circulated through a reservoir 816. The pump 810 and the reservoir 816 may be located in an area generally connected to the ground 230. Thus, the pump 810 and the reservoir 816 may be considered grounded. The reservoir 816 may additionally have an overflow 818 to prevent spilling of the fluid 850.

At the terminal 118, the fluid flow 850 may make electrical contact with the terminal 118 by an electrical connector 804. Between the terminal 118 and the ground 230, the fluid flow 850 may make electrical contacts with a series of electrodes of the acceleration/deceleration column 108 by electrical connectors 806 as shown in FIG. 3. The electrical connectors 804 and 806 may be conductive ferrules (e.g., metal ferrules) and/or metal fittings of an insulating pipe that the fluid 850 may flow in.

The voltage grading system 800 may depend on the electrical resistance of the fluid 850 to achieve a voltage distribution between the terminal 118 and the ground 230. For example, in a high energy acceleration mode of a charged particle acceleration/deceleration system in accordance with the present disclosure that uses the voltage grading system 800, a high voltage may need to be applied between the terminal 118 and the ground 230. The high voltage may be provided by an acceleration power supply such as the acceleration power supply 210 shown in FIG. 2. As previously noted, in this high energy acceleration mode, a relatively low ballast current between each adjacent acceleration electrode, and between the first acceleration electrode and the terminal, may be needed. A fluid supply 814 may provide high electrical resistance fluid (e.g., above 1 MΩcm) to fulfill this requirement.

In another example, in a low energy acceleration mode or a deceleration mode of a charged particle acceleration/deceleration system in accordance with the present disclosure that uses the voltage grading system 800, a low voltage may need to be applied between the terminal 118 and the ground 230. As previously noted, in this low energy acceleration mode or deceleration mode, high ballast current between each adjacent acceleration electrode, and between the first acceleration electrode and the terminal, may be needed. An electrical resistance adjustor may be used to adjust the electrical resistance of the fluid. For example, a saline drip 812 may be used. The saline drip 812 may add saline solution(s) into the fluid flow 850 to change the electrical resistance of the fluid (e.g., below 1 MΩcm) to fulfill this requirement. The overheating issue for high ballast current components may be eliminated because the fluid flow 850 may dissipate heat along the pipe and in the reservoir 816. Further, the fluid flow 850 may act as a cooling medium to cool the electrodes.

In one exemplary embodiment of the voltage grading system 800, a resistivity monitor 820 may be used, as shown in FIG. 3. The resistivity value may be used to automatically control the amount of saline added.

In another exemplary embodiment of the voltage grading system 800, one or more fluid valves may be implemented along the fluid flow 850 between the terminal 118 and the ground 230 to selectively short out gaps between electrodes for low energy acceleration or deceleration operations.

Figure 4:
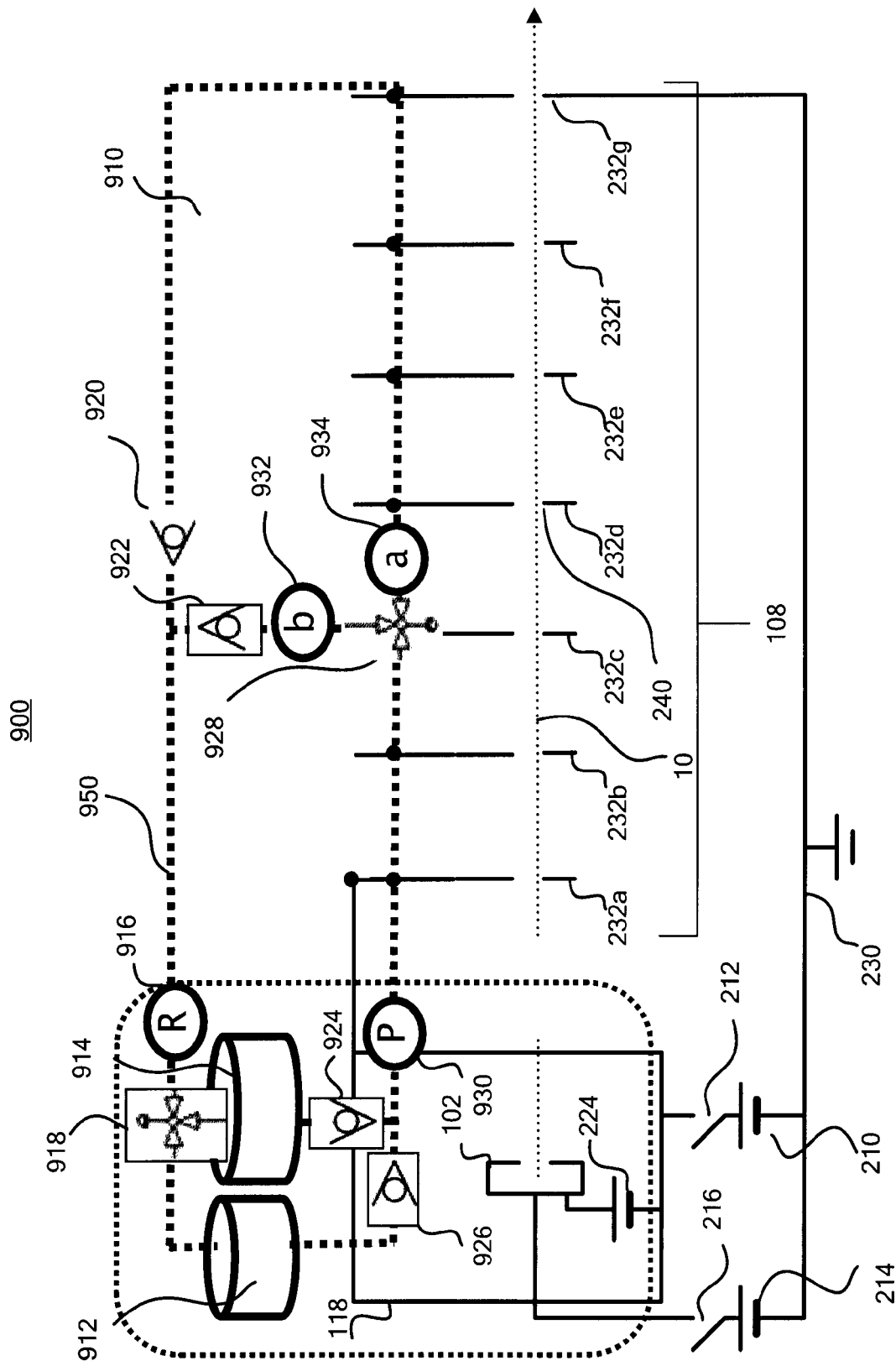
FIG. 4 depicts a schematic diagram of a charged particle acceleration/deceleration system in accordance with an embodiment of the present disclosure.

In yet another exemplary embodiment of the voltage grading system, two or more fluid reservoirs each with fluid of different electrical resistance may be used instead of using the saline drip 812 and the fluid supply 814, as shown in FIG. 4 and described in detail below.

In still another exemplary embodiment of the voltage grading system, a deionization filter may be used. Some of the circulating water may go through the filter and the filter removes ions, so that the resistance of the water may be increased.

In the exemplary embodiment of the voltage grading system 800, DI water may be used as the fluid to circulate in the system 800. It should be noted that other liquid with suitable electrical properties may be used in other exemplary embodiments in accordance with the present disclosure. Furthermore, liquid used in one exemplary embodiment voltage grading system in accordance with the present disclosure may be chilled to help heat dissipation.

FIG. 4 depicts a schematic diagram of a charged particle acceleration/deceleration system 900 in accordance with an embodiment of the present disclosure. It should be appreciated by one skilled in the art that the charged particle acceleration/deceleration system 900 is an exemplary embodiment of a charged particle acceleration/deceleration system in accordance with the present disclosure as described in FIG. 2 incorporating an exemplary embodiment of a voltage grading system in accordance with the present disclosure as described in FIG. 3. As a result, all of the elements in FIG. 4 may be understood in relation to the elements in FIG. 2 and FIG. 3.

Referring to FIG. 4, in the charged particle acceleration/deceleration system 900, the ion beam 10 may be extracted from the ion source 102. The ion source 102 may be powered by the extraction power supply 224. The extraction power supply 224 may provide a positive voltage for the ion source 102 relative to the terminal 118. The ion source 102 may be separated from the ground 230 by the deceleration switch 216 and the deceleration power supply 214. The ion source 102 may also be separated from the ground 230 via the extraction power supply 224, an acceleration switch 212 and an acceleration power supply 210. The terminal 118 may be separated from the ground 230 by the acceleration switch 212 and the acceleration power supply 210.

The extracted ion beam 10 may then pass through an aperture on the terminal 118 and enters an acceleration or deceleration column 108, as shown in FIG. 4. The acceleration or deceleration column 108 may be schematically depicted in FIG. 4 by the plurality of electrodes 232. The plurality of electrodes 232 may be spaced-apart conductive plates having apertures 240. In the example of FIG. 4, the plurality of electrodes 232 may include electrodes 232*a*, 232*b*, 232*c*, 232*d*, 232*e*, 232*f*, and 232*g*. The ion beam 10 may be accelerated or decelerated to a specific energy level and then leave the acceleration or deceleration column 108.

The acceleration or deceleration voltage between the terminal 118 and the ground 230 may be applied to the electrodes 232 by the resistance chain formed by the fluid lines and metal connectors discussed above.

Referring to FIG. 4, the resistance may be achieved by running liquid with different electrical resistance across the voltage gaps between the terminal 118, the electrodes 232 and the ground 230, thus providing voltage grading across the acceleration or deceleration column 108. As shown in FIG. 4, the charged particle acceleration/deceleration system 900 may further comprise a voltage grading system 910. It should be noted that the voltage grading system 910 is one exemplary embodiment of a voltage grading system in accordance with the present disclosure as shown in FIG. 3 and described previously.

The voltage grading system 910 may circulate chilled liquid with a given electrical resistance through electrodes 232 and terminal 118. The voltage grading system 910 may include a first reservoir 912 for storage of high electrical resistance fluid and a second reservoir 914 for storage of low electrical resistance fluid. The electrical resistance of a fluid flow 950 in the circuit of voltage grading system 910 may be monitored by a resistivity monitor 916. The resistivity value may be used to automatically control the valve system. The fluid flow 950 may be driven to circulate by a pump 930. The voltage grading system 910 may further include four uni-directional valves 920, 922, 924, and 926. The uni-directional valves 920 and 922 may be used in conjunction with a three-way valve 928 to choose one fluid circuit from two possible fluid circuits: circuit "a" 934 and circuit "b" 932. The uni-directional valves 924 and 926 may be used in conjunction with a three-way valve 918 to choose a type of fluid from fluid reservoirs 912 or 914. The different combinations of all of the valves' operations will be described in detail later. It should be noted that circuit "a" 934 and circuit "b" 932 are not the only circulation circuits a liquid voltage grading system may implement, and other suitable circuits may be provided in other exemplary embodiments of a voltage grading system in accordance with the present disclosure. Further, the fluid flow 950 may be used as a cooling medium to cool the electrodes 232.

The charged particle acceleration/deceleration system 900 may be designed to achieve a wide range of energy levels for the ion beam 10 (e.g., 1 keV to about 750 keV for single charged particles). A plurality of operation modes may be provided by operating the deceleration switch 216, the acceleration switch 212, the extraction power supply 224, the deceleration power supply 214, and the acceleration power supply 210 in tandem to provide the wide range of energy levels.

For example, in one exemplary operation mode, the charged particle acceleration/deceleration system 900 may operate to achieve high energy levels. In this operation mode, the deceleration switch 216 may be left open and the acceleration switch 212 may be closed. The ion beam 10 may be extracted by a positive extraction voltage provided by the extraction power supply 224. The acceleration power supply 210 may provide a high positive voltage (e.g., 200 kV to 670 kV) between the terminal 118 and the ground 230. Thus, after gaining initial extraction energy, the ion beam 10 may be further accelerated by the electrodes 232. This exemplary mode of operation may be referred to as a high energy acceleration mode ("HE mode") in the present disclosure.

In the HE mode of operation, the voltage grading system 910 may run high electrical resistance fluid through circuit "a" 934. That is, the three-way valves 918 and 928 may be opened to allow high electrical resistance liquid from the reservoir 912 to be pumped by the pump 930 into circulation through circuit "a" 934, and the uni-directional valves 922 and 924 may be closed to prevent back-flow and contamination from the low electrical resistance liquid from reservoir 914. At the same time, the three-way valve 918 may connect the circulation circuit to the reservoir 912 to complete the circulation loop. In this mode of operation, the three-way valve 928 may open to circuit "a" 934.

In another exemplary operation mode, the charged particle acceleration/deceleration system 900 may operate to achieve medium energy levels. In this operation mode, the deceleration switch 216 may be left open and the acceleration switch 212 may be closed. The ion beam 10 may be extracted by an extraction positive voltage provided by the extraction power supply 224. The acceleration power supply 210 may provide a medium positive voltage (e.g., 80 kV to 200 kV) between the terminal 118 and the ground 230. Thus, after gaining initial extraction energy, the ion beam 10 may be further accelerated by the electrodes 232. This exemplary mode of operation may be referred to as a medium energy acceleration mode ("ME mode") in the present disclosure.

In the ME mode of operation, as previously noted, a higher ballast current (e.g., compared to the HE mode) may be required to maintain the voltage gradient across the electrodes 232. The voltage grading system 910 may run low electrical resistance fluid through circuit "b" 932 in the ME mode of operation. That is, the three-way valves 928 and 918 may be opened to allow low electrical resistance liquid from the reservoir 914 to be pumped by the pump 930 into circulation through circuit "b" 932, and the uni-directional valves 920 and 926 may be closed to prevent back-flow and contamination from the high electrical resistance liquid from reservoir 912. At the same time, the three-way valve 918 may connect the circulation circuit to the reservoir 914 to complete the circulation loop. In this mode of operation, the three-way valve 928 may open to circuit "b" 932.

In one exemplary embodiment of voltage grading system 900, mixing of the two fluids to have a third resistance may be allowed if a third reservoir is implemented.

In yet another exemplary operation mode, the charged particle acceleration/deceleration system 900 may operate to achieve low energy levels. In this operation mode, the deceleration switch 216 may be left open and the acceleration switch 212 may be closed. The ion beam 10 may be extracted by a positive extraction voltage provided by the extraction power supply 224. The acceleration power supply 210 may be programmed to provide a low voltage (e.g., 20 kV to 80 kV). Thus, after gaining initial extraction energy, the ion beam 10 may be further accelerated by the electrodes 232. This exemplary mode of operation may be referred to as a low energy acceleration mode ("LE mode") in the present disclosure.

In the LE mode of operation, as in the ME mode of operation, a higher ballast current may be required to maintain the voltage gradient across the electrodes 232 and the voltage grading system 910 may run low electrical resistance fluid through circuit "a" 934 in the LE mode of operation. That is, the three-way valves 928 and 918 may be opened to allow low electrical resistance liquid from the reservoir 914 to be pumped by the pump 930 into circulation through circuit "a" 934, and the uni-directional valves 920 and 926 be closed to prevent back-flow and contamination from the high electrical resistance liquid from reservoir 912. Higher ballast current may be achieved with added current carried by the low electrical resistance fluid flow 950.

In still another exemplary operation mode, the charged particle acceleration/deceleration system 900 may operate to achieve ion energy lower than the extraction energy (e.g., 1 keV to 40 keV for single charge particles). In this operation mode, the deceleration switch 216 may be closed and the acceleration switch 212 may be left open. The ion beam 10 may be extracted by a positive extraction voltage provided by the extraction power supply 224. The deceleration power supply 216 may provide a positive voltage lower than the positive voltage provided by the extraction power supply 224. Thus, the terminal 118 may be placed at a negative voltage relative to the ground 230. Therefore, after gaining initial extraction energy, the ion beam 10 may be decelerated by the electrodes 232. For example, the extraction power supply 224 may provide a positive voltage of 60 kV and the deceleration power supply 214 may provide a positive voltage of 40 kV. Because the deceleration power supply 214 provides a voltage relative to the ground 230, the ion source 102 may be at 40 kV relative to the ground 230. The positive voltage of 60 kV provided by the extraction power supply 224 may be between the ion source 102 and the terminal 118. Thus, the terminal 118 may have a negative voltage of 20 kV relative to the ground 230. This negative voltage of 20 kV may be applied to the electrodes 232 to generate an electrical field in a direction opposite to the direction of travel of ions in the ion beam 10. Therefore, the ion beam 10 may be decelerated by the electrodes 232. This exemplary mode of operation may be referred to as a deceleration mode in the present disclosure.

In the deceleration mode of operation, the desired energy level may be low (e.g., from 2 keV to 40 keV for single charge particles) thereby allowing the voltage applied between the terminal 118 and the ground 230 to be low (e.g., 20 kV in the previous example). As previously noted, a higher ballast current may be required to maintain the voltage gradient across the electrodes 232 and the voltage grading system 910 may run low electrical resistance fluid through circuit "a" 934 in the LE mode of operation. That is, the three-way valves 928 and 918 may be opened to allow low electrical resistance liquid from the reservoir 914 to be pumped by the pump 930 into circulation through circuit "a" 934, and the uni-directional valves 922 and 926 may be closed to prevent back-flow and contamination from the high electrical resistance liquid from reservoir 912. Higher ballast current may be achieved with added current carried by the low electrical resistance fluid flow 950.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A charged particle acceleration/deceleration system comprising:
   an accelerator column, the accelerator column comprising a plurality of electrodes having apertures through which a charged particle beam may pass; and
   a voltage grading system, comprising:
      a first fluid reservoir;
      a first fluid circuit, the first fluid circuit having at least one conductive connector connecting to at least one of the plurality of electrodes; and
      fluid in the first fluid circuit, the fluid having an electrical resistance.

2. The charged particle acceleration/deceleration system of claim 1, wherein the fluid is a fluid flow circulating through the first reservoir and the first fluid circuit.

3. The charged particle acceleration/deceleration system of claim 1, wherein the voltage grading system further comprises a fluid supply.

4. The charged particle acceleration/deceleration system of claim 1, wherein the voltage grading system further comprising an electrical resistance adjustor connected to the fluid.

5. The charged particle acceleration/deceleration system of claim 1, wherein the voltage grading system further comprising a second fluid reservoir.

6. The charged particle acceleration/deceleration system of claim 5, wherein the voltage grading system further comprises two uni-directional valves and a three-way valve, one of the two uni-directional valves connecting the first fluid reservoir to the first fluid circuit, the other of the two uni-directional valves connecting the second fluid reservoir to the first fluid circuit, the three-way valve connecting the fluid to the first fluid reservoir and the second fluid reservoir.

7. The charged particle acceleration/deceleration system of claim 6, wherein the fluid in the first fluid reservoir has a first electrical resistance value and the fluid in the second fluid reservoir has a second electrical resistance value.

8. The charged particle acceleration/deceleration system of claim 1, wherein the voltage grading system further comprises a second fluid circuit.

9. The charged particle acceleration/deceleration system of claim 8, wherein the voltage grading system further comprises two uni-directional valves and a three-way valve, one of the two uni-directional valves connecting the first fluid circuit to the fluid, the other of the two uni-directional valves connecting the second fluid circuit to the fluid, the three-way valve connecting the fluid to the first fluid circuit and the second fluid circuit.

10. The charged particle acceleration/deceleration system of claim 1, wherein the voltage grading system further comprises a resistivity monitor connected to the fluid.

11. The charged particle acceleration/deceleration system of claim 1, wherein the voltage grading system further comprises a pump connected to the fluid.

12. The charged particle acceleration/deceleration system of claim 1, wherein the fluid is de-ionized water.

13. The charged particle acceleration/deceleration system of claim 12, wherein the de-ionized water has additives to lower the resistance.

14. The charged particle acceleration/deceleration system of claim 12, wherein the de-ionized water is chilled.

15. The charged particle acceleration/deceleration system of claim 12, wherein the voltage grading system further comprises a deionization filter.

16. The charged particle acceleration/deceleration system of claim 1, wherein the voltage grading system further comprises at least one resistor connected between two of the plurality of electrodes.

17. A method for controlling a charged particle beam, the method comprising:
   connecting a voltage grading system to an accelerator column, the accelerator column comprising a plurality of electrodes having apertures through which a charged particle beam may pass, the voltage grading system comprising a first fluid circuit with fluid, and the fluid having a electrical resistance value for a first mode of operation; and
   adjusting the electrical resistance of the fluid to a different value for a second mode of operation.

18. The method of claim 17, wherein the fluid is a fluid flow circulating through the first fluid circuit.

19. The method of claim 18, wherein the voltage grading system further comprises a second fluid circuit.

20. The method of claim 19, further comprising switching the fluid flow to circulate through the second fluid circuit.

21. The method of claim 17, wherein the voltage grading system further comprises a electrical resistance adjustor, wherein adjusting the electrical resistance of the fluid to a different value comprises adding a conductive fluid solution to the fluid through the electrical resistance adjustor.

22. The method of claim 17, wherein the voltage grading system further comprises a first fluid reservoir and a second fluid reservoir, wherein adjusting the electrical resistance of the fluid to a different value comprises switching from the first fluid reservoir to the second fluid reservoir.

23. The method of claim 22, wherein the voltage grading system further comprises a third reservoir, wherein adjusting the electrical resistance of the fluid to a different value comprises mixing the fluid from the first and second reservoirs together in the third reservoir.

24. The method of claim 17, further comprising connecting at least one resistor between two of the plurality of electrodes.

* * * * *